(12) United States Patent
Wang et al.

(10) Patent No.: US 12,015,239 B2
(45) Date of Patent: Jun. 18, 2024

(54) LASER DIODE TESTING SYSTEM AND LASER DIODE TESTING METHOD

(71) Applicant: CHROMA ATE INC., Taoyuan (TW)

(72) Inventors: Sheng-Hung Wang, Taoyuan (TW); Po-Hsiang Chang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 61 days.

(21) Appl. No.: 17/536,153

(22) Filed: Nov. 29, 2021

(65) Prior Publication Data

US 2022/0209493 A1 Jun. 30, 2022

(30) Foreign Application Priority Data

Dec. 31, 2020 (TW) ................................ 109147126

(51) Int. Cl.
*H01S 5/00* (2006.01)
*G01R 31/26* (2020.01)

(52) U.S. Cl.
CPC ........ *H01S 5/0014* (2013.01); *G01R 31/2635* (2013.01)

(58) Field of Classification Search
CPC .......................... H01S 5/0014; G01R 31/2635
See application file for complete search history.

(56) References Cited

U.S. PATENT DOCUMENTS 4,489,477 A * 12/1984 Chik .................. G01R 31/2635
324/750.05
2010/0134135 A1 6/2010 Park
2010/0231233 A1 9/2010 Dasnurkar
2011/0074458 A1 3/2011 Di Stefano et al.
(Continued)

FOREIGN PATENT DOCUMENTS

CN 209878273 U * 12/2019
JP 8150583 A 6/1996
(Continued)

OTHER PUBLICATIONS

TW Notice of Allowance dated Nov. 22, 2021 issued in Taiwan application No. 109147126.
(Continued)

*Primary Examiner* — Giovanni Astacio-Oquendo
*Assistant Examiner* — Haidong Zhang
(74) *Attorney, Agent, or Firm* — McClure, Qualey & Rodack, LLP (57) ABSTRACT

The present invention relates to a laser diode testing system and a laser diode testing method. The method comprises the steps of moving a laser bar or a plurality of laser diodes to a first test station by means of a first transfer device; then, electrically contacting each laser diode by a first probe module in sequence; measuring electrical and optical characteristics of the laser diodes electrically contacted by the first probe module sequentially by means of a first measuring device; moving the laser bar or the plurality of laser diodes out of the first test station by means of the first transfer device, wherein a magnetic field generated by an electromagnetic generating unit of an electromagnetic slide interacts with a magnetic field of a permanent magnet of the first transfer device, so that the first transfer device is driven and moved.

8 Claims, 9 Drawing Sheets

(56) References Cited

U.S. PATENT DOCUMENTS

| | | | |
|---|---|---|---|
| 2012/0320369 A1* | 12/2012 | Cheng | G01J 3/024 |
| | | | 356/73 |
| 2013/0236087 A1* | 9/2013 | Lee | G01R 31/2635 |
| | | | 702/58 |
| 2015/0177318 A1 | 6/2015 | Di Stefano et al. | |

FOREIGN PATENT DOCUMENTS

| | | | |
|---|---|---|---|
| JP | 8236594 A | 9/1996 |
| JP | 200028681 A | 1/2000 |
| JP | 200240101 A | 2/2002 |
| JP | 2011220704 A | 11/2011 |
| JP | 201324829 A | 2/2013 |

OTHER PUBLICATIONS

JP Office Action dated Dec. 20, 2022 issued in Japanese application No. 2021-211086.
Search Report dated Nov. 19, 2021 issued in TW Notice of Allowance in Taiwan application No. 109147126.

* cited by examiner

LASER DIODE TESTING SYSTEM AND LASER DIODE TESTING METHOD

BACKGROUND OF THE INVENTION

Field of the Invention

The present invention relates to a laser diode testing system and a laser diode testing method, in particular to a laser diode testing system and a laser diode testing method for testing the electrical and optical characteristics of an edge emitting laser (EEL) diode.

Description of the Related Art

Laser diodes are widely used, in optical communications, material processing, medical treatment, sensing, printing, display, optical storage and illumination. However, with the continuous progression of the laser diode manufacturing process, the volume of the laser diode is reduced, accuracy of the laser diode is improved, and difficulty in measuring the characteristics of the laser diode is increased.

Typically, in the existing test technology, one station exclusive for testing a single function at a predetermined temperature is used. Specifically, in an independent test station, a single laser diode bar or an individual laser diode (hereinafter referred to as a device under test) is heated or cooled to a certain temperature, and a single characteristic or function of the device under test is tested. However, according to the current test requirements, various photoelectric tests and optical characteristic tests usually have to be performed at three different test temperatures (i.e. a low temperature, a room temperature and a high temperature).

In other words, testing 4 test items at 3 different temperatures mentioned above requires 10 or more independent test stations. This is not only costly, but also requires a large factory space and other auxiliary equipment including cold and heat sources, pneumatic and hydraulic sources and power supplies. Moreover, transferring the device under test into or from different test stations and repositioning the device under test lead to an increase in risk factors, not to mention the costs of construction, maintenance and operation time.

It can be seen from above that a laser diode testing system and a laser diode testing method that can achieve multi-temperature and multi-function tests in a single flow line is indeed highly expected in the industry.

SUMMARY OF THE INVENTION

The main object of the present invention is to provide a laser diode testing system and a laser diode testing method, which can integrate multiple test stations on a single flow line and can flexibly increase or decrease the number of test stations, adjust the order of test stations or adjust the distances among test stations. Therefore, the test efficiency can be greatly improved, the equipment construction costs can be reduced, and the space occupied by the equipment can be reduced.

In order to achieve the above object, a laser diode testing system for testing a plurality of laser diodes, each laser diode including at least one contact, comprises a first transfer device, a first test station, and a main controller. The first transfer device is coupled to an electromagnetic slide, wherein the first transfer device includes at least one permanent magnet, and the electromagnetic slide includes a plurality of magnetic field excitation units arranged in a longitudinal direction of the electromagnetic slide. The plurality of laser diodes are placed on the first transfer device. The first test station includes a first measuring device and a first probe module. The main controller is electrically connected to the plurality of magnetic field excitation units of the electromagnetic slide, the first measuring device, and the first probe module. A magnetic field is generated by at least one of the plurality of magnetic field excitation units of the electromagnetic slide under control of the main controller and interacts with a magnetic field generated by the at least one permanent magnet of the first transfer device, so that the first transfer device is driven to transfer the plurality of laser diodes to the first test station or away from the first test station. When the first transfer device is located at the first test station, the first probe module is controlled by the main controller and brought into electrical contact with the at least one contact of each laser diode in sequence, and the first measuring device is controlled by the main controller and sequentially measures at least one of an electrical characteristic and an optical characteristic of each laser diode electrically contacted by the first probe module.

It can be seen from the above that the present invention uses the magnetic field excitation units on the electromagnetic slide to drive the first transfer device in a magnetic levitation manner. Therefore, the first transfer device can transfer the plurality of laser diodes without any wiring, and each transfer device can be independently controlled. The transfer speed or the transfer distance can be easily adjusted, and the transfer precision is high and easy to be calibrated. In this way, each test station can be modularized according to the present invention, so multiple test stations can be integrated in a single flow line, and the number of test stations can be easily increased or decreased according to actual needs, the distances among test stations can be flexibly adjusted, and the order of test stations can be changed, thereby improving the test efficiency, reducing the equipment construction costs, and reducing the space occupied by the equipment.

Preferably, the laser diode testing system of the present invention can further comprise a second test station, a second transfer device, and a pick-and-place device. The second test station includes a second measuring device and a second probe module, the second transfer device is coupled to the electromagnetic slide, and the pick-and-place device is disposed between the first test station and the second test station. The second measuring device, the second probe module, and the pick-and-place device are electrically connected to the main controller. After the first measuring device of the first test station has measured at least one of the electrical characteristic and the optical characteristic of the plurality of laser diodes, the first transfer device is driven by the main controller and transfers the plurality of laser diodes away from the first test station, and the pick-and-place device is controlled by the main controller and transfers the plurality of laser diodes onto the second transfer device, the second transfer device is driven by the main controller and transfers the plurality of laser diodes to the second test station, the second probe module is controlled by the main controller and brought into electrical contact with the at least one contact of each laser diode in order, and the second measuring device is controlled by the main controller and measures at least one of the electrical characteristic and the optical characteristic of the plurality of laser diodes electrically contacted by the second probe module.

In other words, as described in the previous paragraph, each test station of the present invention can be equipped with a transfer device, and a pick-and-place device, which is responsible for transporting a plurality of laser diodes between the transfer devices of two test stations, can be arranged between every two test stations. Accordingly, the transfer device of each test station can independently move in and out of its own test station, and each test station can independently test the laser diodes and would not interfere with the other test station. Because each test station only corresponds to a single transfer device having the same transfer path, the transfer precision is high and easy to be calibrated.

Furthermore, the laser diode testing system of the present invention can comprise a guide rail arranged in parallel with the electromagnetic slide, and the first transfer device can further include a sliding frame coupled to the guide rail and slidable on the guide rail. Also, the sliding frame can further include a temperature control unit and a holder assembly. The temperature control unit is coupled to the holder assembly and provided to heat or cool the holder, and the holder assembly is provided to hold the plurality of laser diodes. In other words, by arrangement of the guide rail, the sliding frame coupled to the guide rail and the holder assembly arranged on the sliding frame are moved with the first transfer device, so that the load of the first transfer device can be reduced while the stability of the structure and the transfer of the device under test is increased, thereby further improving the transfer precision. In the present invention, the temperature of the holder assembly can be adjusted by the temperature control unit, so that a specific high temperature or low temperature test environment for the plurality of laser diodes can be provided.

The holder assembly of the present invention can include a body and a detachable holder. The body includes a negative pressure channel, and the detachable holder is provided with at least one suction hole on its upper surface. One end of the negative pressure channel communicates with a negative pressure source, and the other end of the negative pressure channel communicates with the at least one suction hole. On the other hand, the detachable holder of the present invention includes a carrying surface, a vertical surface and a beveled surface. The carrying surface has a width equivalent to a width of the plurality of laser diodes and is provided to carry the plurality of laser diodes. The at least one suction hole is formed on the carrying surface. The vertical surface is connected to one lateral edge of the carrying surface while the beveled surface is connected to the other lateral edge of the carrying surface, and the beveled surface and the carrying surface form an included angle θ in a range from 30 degrees to 90 degrees. With the above configuration, the detachable holder of the present invention can be replaced according to the specification of the device under test (the laser diode), and the plurality of laser diodes are held by means of negative pressure suction so as to prevent the laser diodes from being damaged. The angle of the beveled surface of the detachable holder of the present invention is set according to the divergence angle of the laser diode so as to prevent the emission light of the laser diode from being blocked by the detachable holder, so that the test precision would not be affected.

In addition, at least one of the first transfer device and the electromagnetic slide of the present invention can further include a position signal generating unit, which is electrically connected to the main controller and provided to generate a real-time position signal by detecting a real-time position of the first transfer device and send the real-time position signal to the main controller. Accordingly, the first transfer device of the present invention can be precisely positioned with aid of the position signal generating unit.

In order to achieve the aforementioned object, a laser diode testing method of the present invention, each laser diode including at least one contact, comprises the steps of: (A) moving the plurality of laser diodes to a first test station by a first transfer device, the first test station including a first measuring device and a first probe module; (B) controlling the first probe module to electrically contact the at least one contact of each laser diode in sequence and controlling the first measuring device to measuring at least one of an electrical characteristic and an optical characteristic of each laser diode electrically contacted by the first probe module in sequence; and (C) moving the plurality of laser diodes out of the first test station by the first transfer device, wherein the first transfer device is coupled to an electromagnetic slide; wherein the first transfer device includes at least one permanent magnet, and the electromagnetic slide includes a plurality of magnetic field excitation units arranged in a longitudinal direction of the electromagnetic slide; in the step (A) and the step (C), a magnetic field is generated by at least one of the plurality of magnetic field excitation units of the electromagnetic slide under control of the main controller and interacts with a magnetic field generated by the at least one permanent magnet of the first transfer device, so that the first transfer device is driven to transfer the plurality of laser diodes to the first test station or out of the first test station.

Accordingly, as described above, in the method provided by the present invention, the first transfer device is independently driven in a magnetic levitation manner, and each test station is modularized, so that multiple stations can be integrated in a single flow line. As a result, it is possible to flexibly increase or decrease the number of test stations, adjust the distances among test stations and change the order of the test stations, etc. It allows the conventional laser diode testing method to be greatly changed, and efficiency and cost are significantly improved.

DESCRIPTION OF THE PREFERRED EMBODIMENTS

Before a laser diode testing system and a laser diode testing method of the present invention are described in detail in the embodiments, it should be particularly noted that in the following description, similar components will be designated by the same reference numerals. The drawings of the present invention are merely illustrative, and they are not necessarily drawn to scale, and not all details are necessarily presented in the drawings.

Figure 1:
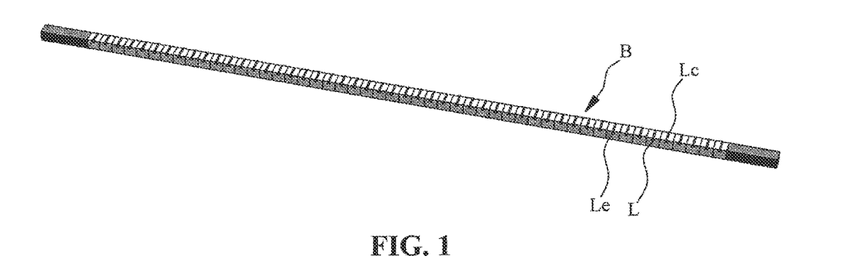
FIG. 1 is a perspective view of a laser bar.

Reference is made to FIG. 1, which is a perspective view of a laser bar which is a device under test (DUT) of this embodiment. In this embodiment, the device under test is an edge emitting laser (EEL) diode, i.e. the laser bar B shown in FIG. 1, which is an elongated bar consisting of multiple laser diodes L. Each laser diode L includes two contacts Lc and two emitting points Le. However, only one contact Lc and one emitting point Le are shown in FIG. 1. The two emitting points Le are located on two opposite sides of the laser diode L respectively, that is, light is emitted from the two sides. It should be particularly noted that although the device under test in the following embodiment is the laser bar B, the present invention is applicable not only to the test of the laser bar B, but also to the test of multiple independent laser diodes which will be described later.

Figure 2A:
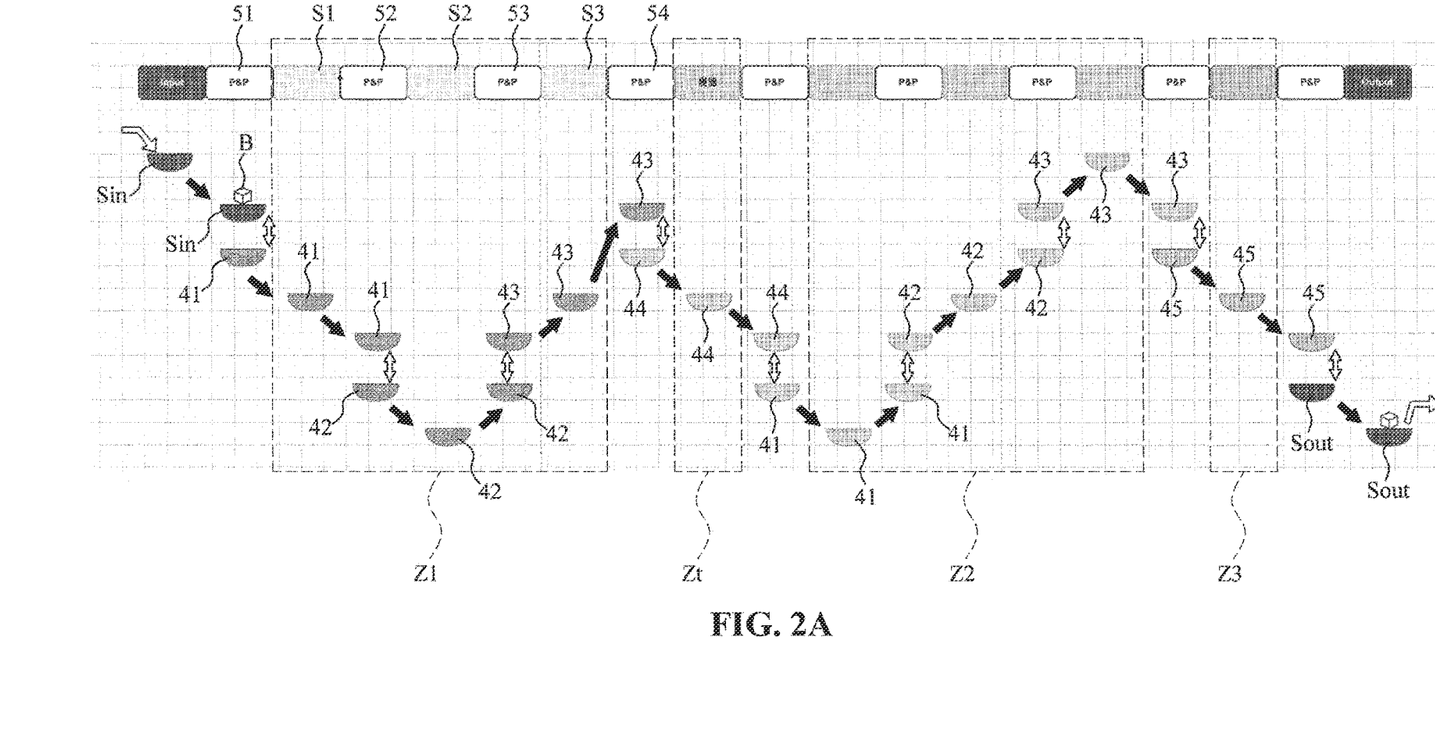
FIG. 2A is a schematic diagram showing the configuration and the transfer process of each test station of a preferred embodiment of a laser diode testing system of the present invention.

Reference is made to FIG. 2A, which is a schematic diagram showing the configuration and the transfer process of each test station of a preferred embodiment of a laser diode testing system of the present invention. As shown in the figure, the laser diode testing system of this embodiment mainly comprises a first test section Z1, a second test section Z2, a third test section Z3, and a temperature-changing section Zt. A high temperature or low temperature test is performed in the first test section Z1 at a temperature, for example, much higher or lower than the room temperature. A room temperature test is performed in the second test section Z2 after changing the temperature. Each of the first test section Z1 and the second test section Z2 includes three test stations for performing a photoelectric test and optical characteristic tests respectively. In the third test section Z3, an appearance defect test is performed.

The configuration and the transfer process of each test station in this embodiment are first briefly described. As shown in FIG. 2A, a loading shuttle Sin transfers the laser bar B to be tested to a first pick-and-place device 51, and the first pick-and-place device 51 transports the laser bar B onto a first transfer device 41. Then, the first transfer device 41 transfers the laser bar B to the first test station S1 where a photoelectric test is performed. After the photoelectric test is completed, the first transfer device 41 transfers the laser bar B to a second pick-and-place device 52, and the second pick-and-place device 52 transports the laser bar B onto a second transfer device 42. Then, the second transfer device 42 transfers the laser bar B to the second test station S2 where an optical characteristic test is performed. After the optical characteristic test is completed, the second transfer device 42 transfers the laser bar B to a third pick-and-place device 53, and the third pick-and-place device 53 transports the laser bar B onto a third transfer device 43. Then, the third transfer device 43 transfers the laser bar B to the third test station S3 where another optical characteristic test is performed.

After another optical characteristic test is completed at the third test station S3, the third transfer device 43 transfers the laser bar B to a fourth pick-and-place device 54, and the fourth pick-and-place device 54 transports the laser bar B onto a fourth transfer device 44. It should be particularly noted that the fourth transfer device 44 is located in the temperature-changing section Zt where a temperature-changing step is performed for regulating the temperature at which the high-temperature test is performed in the first test section Z1 is lowered to room temperature at which the room temperature test is to be performed in the second test section Z2. Since the test procedure and the transfer method of the second test section Z2 are the same as those of the first test section Z1, the description of the second test section Z2 is omitted. After all the tests in the second test section Z2 for the laser bar B are completed, a fifth transfer device 45 transfers the laser bar B to the third test section Z3 where the surface appearance defect test is performed. When the test is completed, the laser bar B is transferred out by an unloading shuttle Sout.

Figure 2B:
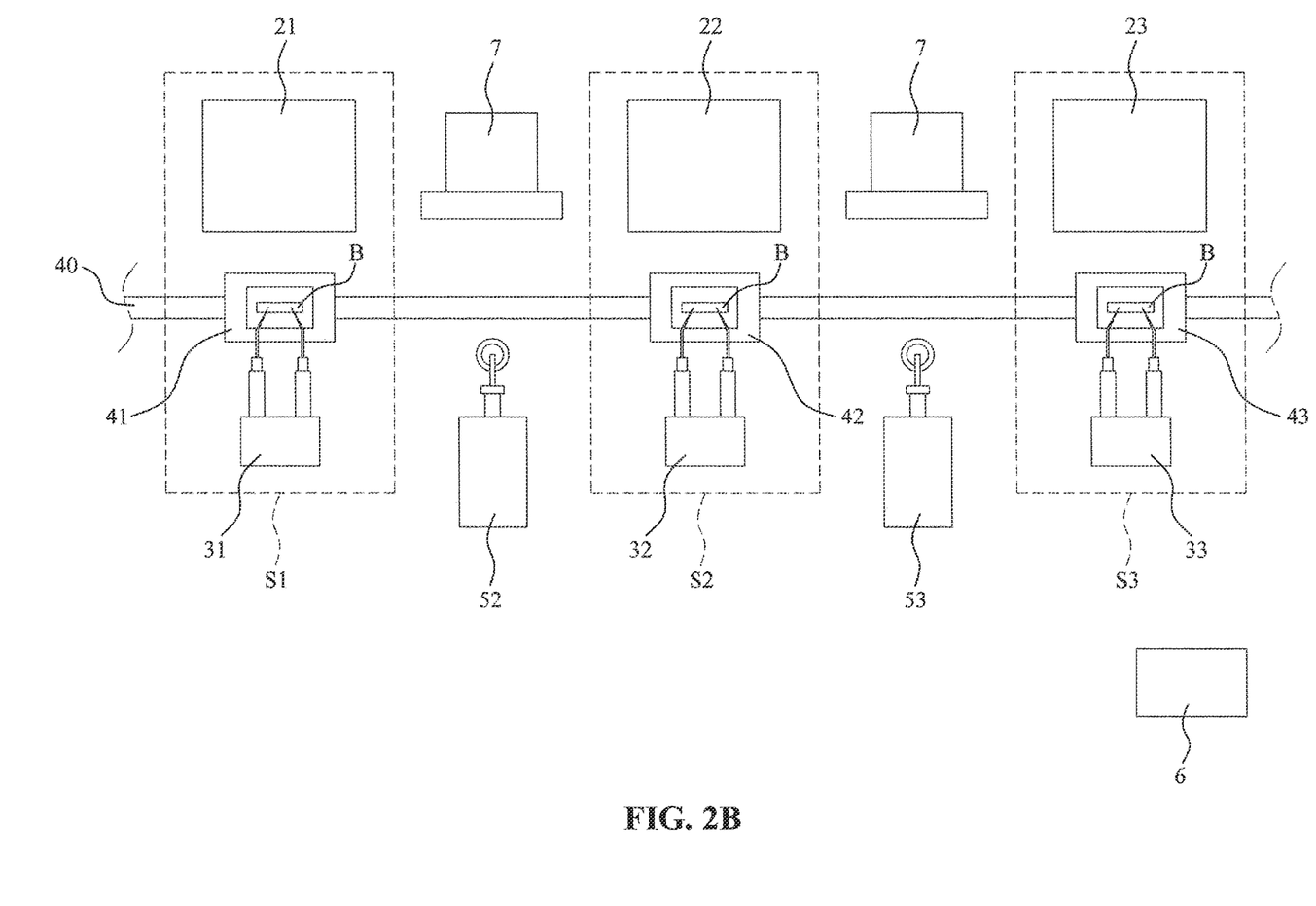
FIG. 2B is a schematic diagram showing the configuration of each device in a first test section of the laser diode testing system of the present invention.

Reference is made to FIG. 2B, which is a schematic diagram showing the configuration of each device in the first test section of the laser diode testing system of the present invention. The following description concerning this embodiment is mainly based on the first test section Z1. As shown in FIG. 2B, the first test section Z1 of this embodiment mainly includes a first test station S1, a second test station S2, a third test station S3, a first transfer device 41, a second transfer device 42, a third transfer device 43, a second pick-and-place device 52, a third pick-and-place device 53, a main controller 6, and two position calibration modules 7. It should be noted that the main controller 6 is listed in the first test section Z1 for illustrative purpose. However, the main controller 6 should belong to the entire test system, that is, the main controller 6 controls all the components in all the test sections, the pick-and-place devices among the test sections, and the unloading shuttle and loading shuttle in the test system.

Figure 3:
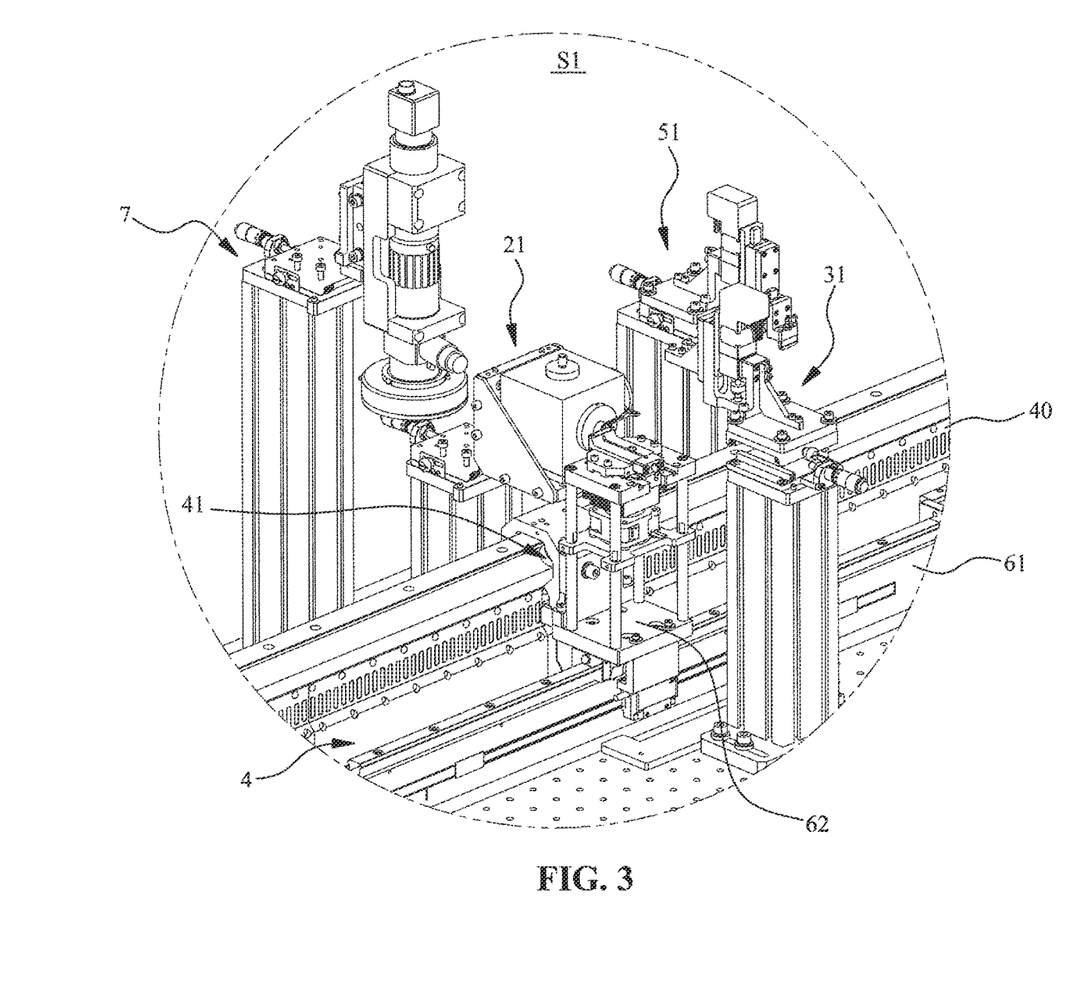
FIG. 3 is a perspective view of a first test station of the laser diode testing system of the present invention.
Figure 4:
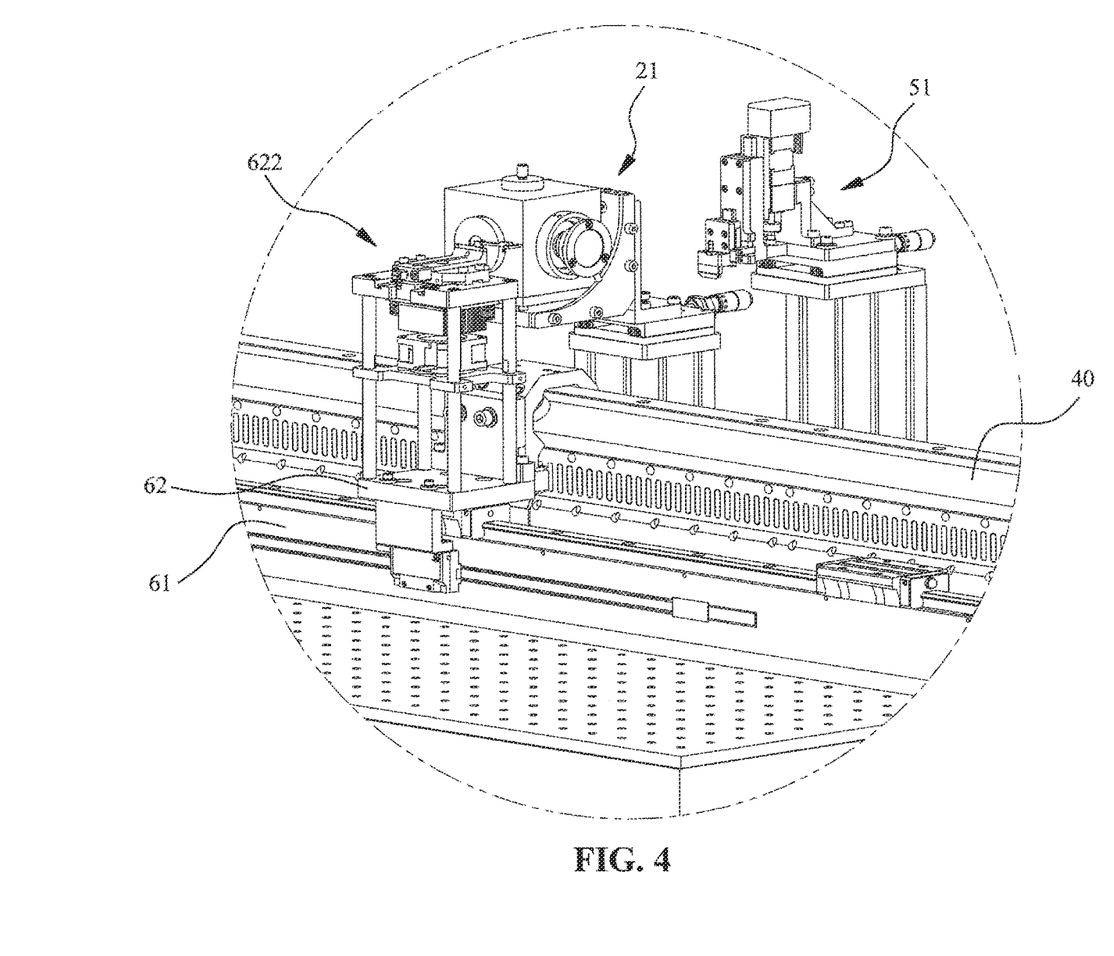
FIG. 4 is another perspective view of the first test station of the laser diode testing system of the present invention, with a probe module and a position calibration module being removed.
Figure 5:
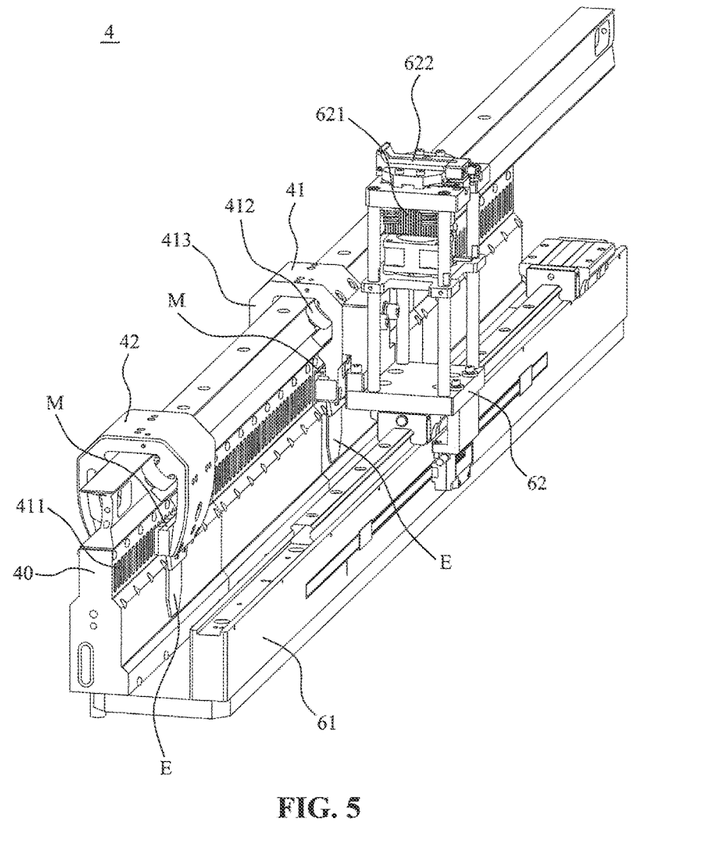
FIG. 5 is a perspective view of a transfer module for a device under test of the present invention.

Reference is made to FIG. 3, FIG. 4 and FIG. 5. FIG. 3 is a perspective view of the first test station of the laser diode testing system of the present invention, FIG. 4 is another perspective view of the first test station of the laser diode testing system of the present invention with a probe module and a position calibration module being removed, and FIG. 5 is a perspective view of a device-under-test transfer module of the present invention. As shown in the figures, in this embodiment, each test station is provided with a transfer device, and a pick-and-place device and a position calibration module 7 are arranged between two adjacent test stations. The position calibration module 7 of this embodiment is a calibration module mainly based on a camera device. The camera device is used to capture images before and after the pick-and-place operation of the pick-and-place device for calibrating the orientation of the laser bar B, i.e., calibrating position repeatability.

The first transfer device 41 is coupled to an electromagnetic slide 40. The first transfer device 41 includes a U-shaped frame 413, six rollers 412, and a plurality of permanent magnets M. The rollers 412 and the permanent magnets M are arranged inside the U-shaped frame 413 and coupled to the two opposite sides of the electromagnetic slide 40. The rollers 412 are located between the U-shaped frame 413 and the electromagnetic slide 40 so as to prevent the U-shaped frame 413 from being in direct contact with the electromagnetic slide 40 and to reduce the friction between the U-shaped frame 413 and the electromagnetic slide 40 and facilitate the U-shaped frame 413 sliding with respect to the electromagnetic slide 40.

As shown in FIG. 5, a DUT transfer module 4 of this embodiment is provided to transfer the laser bar B between the test station and the pick-and-place device. As shown in the figure, the electromagnetic slide 40 mainly includes a rail, and a plurality of magnetic field excitation units 411 are equidistantly arranged in a longitudinal direction on the two side walls of the rail. Each electromagnetic generating unit 411 is mainly composed of a coil winding. On the other hand, the permanent magnets M of the first transfer device 41 correspond to the magnetic field excitation units 411 of the electromagnetic slide 40. Therefore, when an excitation current is applied to the electromagnetic generating unit 411, the coil winding of the electromagnetic generating unit 411 generates a magnetic field to interact with the magnetic field of the permanent magnets M of the first transfer device 41 so as to bias the first transfer device 41 to move on the electromagnetic slide 40. The bias force for the first transfer device 41 can be determined by adjusting the magnitude of the excitation current.

Moreover, as shown in FIGS. 3 to 5, the DUT transfer module 4 of this embodiment further includes a guide rail 61, which is arranged in parallel with the electromagnetic slide 40. A sliding frame 62 is arranged to slid on the guide rail 61, and a holder assembly 622 for holding the laser bar B is mounted on the sliding frame 62. In other words, the sliding frame 62 and the guide rail 61 are actually used to transfer the device under test and to bear the load, and the first transfer device 41 is a driver, which is provided to drive the sliding frame 62. Accordingly, this design is advantageous in that the load of the first transfer device 41 can be reduced so that the stability of the structure and thus the transfer precision are improved.

The first transfer device 41 includes a position signal generating unit E, which is an encoder scale, also referred to as an optical ruler, and which is electrically connected to the main controller 6 and provided for detecting the real-time position of the first transfer device 41 so as to generates a real-time position signal to the main controller 6. In brief, the position signal generating unit E provides the absolute position of the first transfer device 41 to the main controller 6 in a non-contact sensing way for positioning the first transfer device 41, thereby enabling a high-precision transfer operation.

Furthermore, as shown in FIG. 2B, FIG. 3, and FIG. 4, each test station includes a measuring device and a probe module. In the first test station S1, a first measuring device 21 is provided to perform a photoelectric test in which the DC characteristic and the optical power of each laser diode are measured. A first probe module 31 is provided to electrically contact the contacts of the laser diode for applying an electric current.

Similarly, the second test station S2 includes a second measuring device 22 and a second probe module 32, and the third test station S3 also includes a third measuring device 23 and a third probe module 33. In this embodiment, the second measuring device 22 and the third measuring device 23 are provided to perform optical characteristic tests.

Figure 6A:
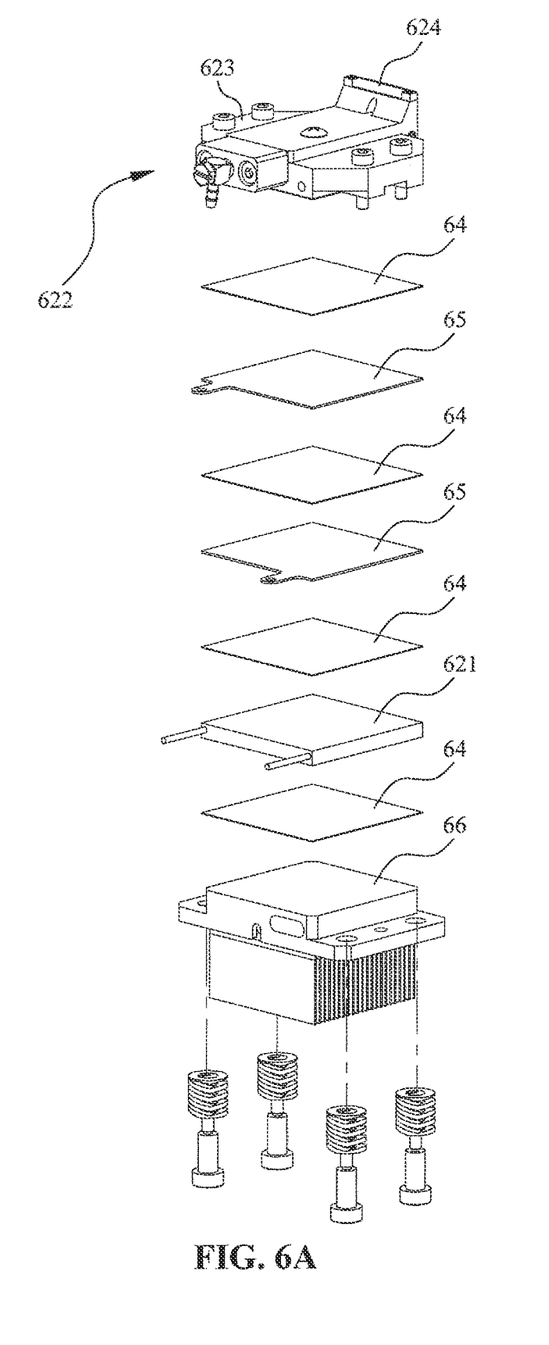
FIG. 6A is a perspective view of a temperature control unit and a holder assembly of the present invention.
Figure 6B:
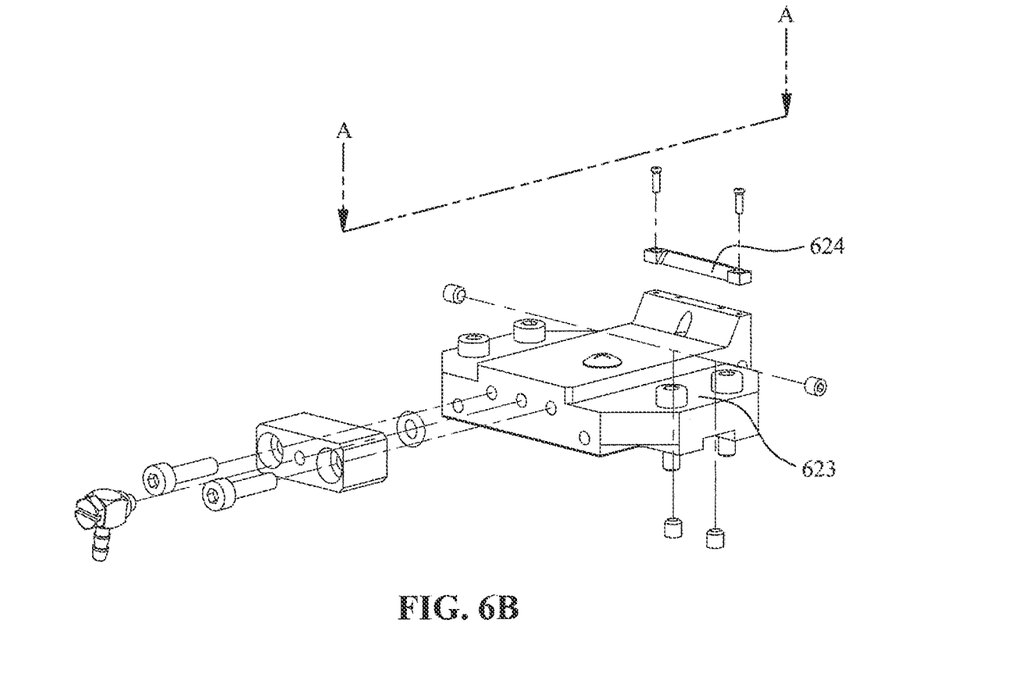
FIG. 6B is an exploded view of the holder assembly of the present invention.
Figure 6C:
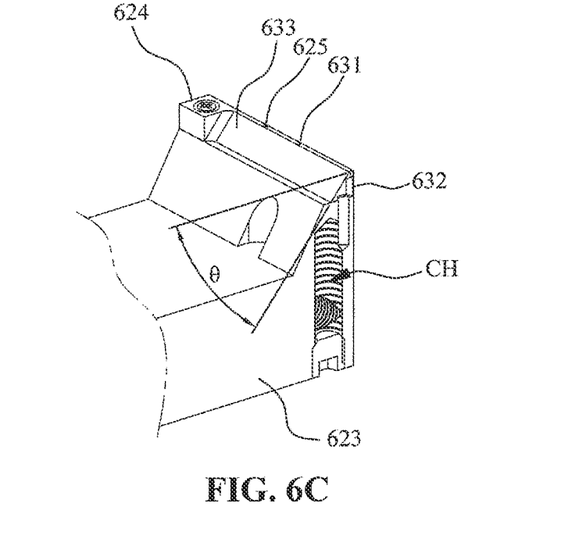
FIG. 6C is a partial enlarged cross-sectional view of the holder assembly of the present invention.

Reference is made to FIGS. 5, 6A, 6B, and 6C. FIG. 6A is a perspective view of a temperature control unit and a holder assembly of the present invention, FIG. 6B is an exploded view of the holder assembly of the present invention, and FIG. 6C is a partial enlarged cross-sectional view of the holder assembly of the present invention. The holder assembly 622 and its related components of this embodiment will be described in detail. As shown in FIG. 5, the holder assembly 622 of this embodiment is assembled on the sliding frame 62, and two anti-interference sheets 65, a temperature control unit 621, and a heat dissipating unit 66 are arranged beneath the holder assembly 622 in this order while a heat conducting sheet 64 is interposed between two adjacent components aforementioned.

The temperature control unit 621 of this embodiment is a thermal electric cooler (TEC), which is capable of regulating the temperature of the holder assembly 622 through the anti-interference sheets 65 and the heat-conducting sheet 64, so that the laser bar B on the holder assembly 622 can be heated or cooled. Moreover, the heat dissipating unit 66 is provided under the temperature control unit 621 and can be used for rapid heat dissipation in the case that the temperature has to be changed. Preferably, a heat dissipating fan can be arranged under the fins of the heat dissipating unit 66.

As shown in FIG. 6B and FIG. 6C, the holder assembly 622 of this embodiment includes a body 623 and a detachable holder 624. The body 623 includes a negative pressure channel CH, and the detachable holder 624 is provided with two suction holes 625 on its upper surface. The location of the two suction holes 625 corresponds to the shape of the laser bar B, that is, the two suction holes 625 are provided in such a manner that the laser rod body B is sucked at its both ends in the long direction of the laser rod body B. One end of the negative pressure channel CH communicates with a negative pressure source (not shown in the figure), and the other end of the negative pressure channel CH communicates with the two suction holes 625. In other words, the detachable holder 624 can suck and hold the laser bar B by means of the two suction holes 625. It is more important that the detachable holder 624 of this embodiment can be replaced at any time with another suitable detachable holder depending on the specification of the device under test (the laser bar B).

As shown in FIG. 6C, the detachable holder 624 of this embodiment includes a carrying surface 631, a vertical surface 632 and a beveled surface 633. The width of the carrying surface 631 is equivalent to the width of the laser bar B and is provided to carry the laser bar B. The two suction holes are formed on the carrying surface 631. The vertical surface 632 is connected to one lateral edge of the carrying surface while the beveled surface 633 is connected to the other lateral edge of the carrying surface. The beveled surface 633 and the carrying surface 631 form an included angle $\theta$ in a range from 30 degrees to 90 degrees. Accordingly, this design is especially suitable for the device-under-test which is an edge emitting laser (EEL) diode because its emitting surfaces are the two corresponding sides of its body. The beveled surface 633 is so designed that the emission light of the edge emitting laser diode is prevented from being blocked by the holder body. In other words, the emission light of the laser bar B is prevented from being blocked so that the test precision would not be affected.

Reference is made to FIG. 2B. The operation of the first test section Z1 in this embodiment will be described in detail below. First, the first transfer device 41 moves the laser bar B to be tested to the first test station S1. In this step, the temperature control unit 621 (see FIG. 6A) preheats the holder assembly 622 to a high temperature. Since the laser bar B is placed on the holder assembly 622, the temperature of the laser bar B can be raised very quickly. Then, the main controller 6 controls the first probe module 31 to electrically contact the contact Lc of each laser diode L of the laser bar B in sequence and controls the first measuring device 21 to sequentially measure the DC characteristic and the optical power of the laser diode L electrically contacted by the first probe module 31. It should be particularly noted that when each laser diode L of the laser bar B is tested, the first transfer device 41 is still responsible for moving the laser bar B so that the first measuring device 21 is aligned with the emitting points Le of each laser diode L to be measured, and the first probe module 31 is aligned with the contact Lc of each laser diode L, wherein the first probe module 31 is simply lifted up and lowered.

After the photoelectric test of the first test station S1 is completed, the first transfer device 41 moves the laser bar B out of the first test station S1 and transfers it to the position directly under the second pick-and-place device 52, and the second pick-and-place device 52 takes out the laser bar B from the first transfer device 41. The first transfer device 41 which is not loaded with the device under test is moved away from the position directly under the second pick-and-place device 52. The second transfer device 42 which is not loaded with the device under test is moved to the position directly under the second pick-and-place device 52, and the second pick-and-place device 52 places the sucked laser bar B onto the second transfer device 42. The second transfer device 42 moves the laser bar B to the second test station S2, and the main controller 6 controls the second probe module 32 to electrically contact the contact Lc of each laser diode L of the laser bar B in sequence and controls the second measuring device 22 to sequentially measure the optical characteristic of the laser diode L electrically contacted by the second probe module 32.

After the optical measurement of the second test station S2 is completed, the second transfer device 42 moves the laser bar B out of the second test station S2 and transfers it to a position directly under the third pick-and-place device 53 The third pick-and-place device 53 takes out the laser bar B from the second transfer device 42, and the second transfer device 42 which is not loaded with the device under test is moved away from the position directly under the third pick-and-place device 53. The third transfer device 43 which is not loaded with the device under test is moved to the position directly under the third pick-and-place device 53, and the third pick-and-place device 53 places the sucked laser bar B onto the third transfer device 43. Then, the third transfer device 43 moves the laser bar B to the third test station S2, and the main controller 6 controls the third probe module 33 to electrically contact the contact Lc of each laser diode L of the laser bar B in sequence and controls the second measuring device 23 to sequentially measure another optical characteristic of the laser diode L electrically contacted by the third probe module 33.

Figure 7:
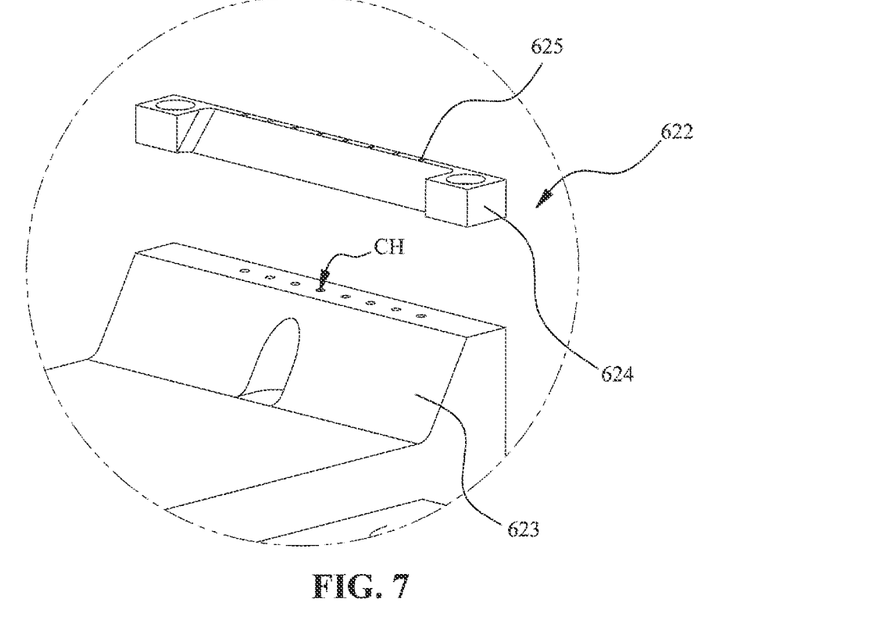
FIG. 7 is a partial enlarged cross-sectional view of another embodiment of the holder assembly of the present invention.

Reference is made to FIG. 7, which is a partial enlarged cross-sectional view of another embodiment of the holder assembly of the present invention. This embodiment is mainly used to illustrate that the present invention can also be applied to the test of multiple independent laser diodes if the type of the holder assembly 622 is changed. Specifically, as shown in FIG. 7, the main body 623 of the holder assembly 622 of this embodiment includes 8 negative pressure channels CH which correspond to 8 suction holes 625 formed in the detachable holder 624. Each suction hole 625 can suck and hold a laser diode (not shown). Accordingly, the holder assembly 622 of this embodiment can be loaded with 8 laser diodes. Each negative pressure channel CH can be independently controlled so that each laser diode can be independently held or released.

In summary, each test station can be modularized in the present invention and is equipped with a transfer device, and a pick-and-place device is arranged between every two test stations. Therefore, a user can arbitrarily increase or decrease the number of test stations according to actual needs and arbitrarily change the test stations, and the user can easily adjust the distances among test stations. The transfer devices of the present invention adopt a magnetic levitation transfer module. Each transfer device can be independently controlled and operated, and moves in a respective test station. The repeatability of the action is extremely high, the probability of error formation is low, and it is also easy to be calibrated, so the transfer precision is quite high. More importantly, the mover (the transfer device) does not have any wiring and is simplified. The present invention is applicable not only to the test of a laser bar, but also to the test of a single independent laser diode if the holder assembly is changed.

The preferred embodiments of the present invention are illustrative only, and the claimed inventions are not limited to the details disclosed in the drawings and the specification. Accordingly, it is intended that it have the full scope permitted by the language of the following claims.

What is claimed is:

1. A laser diode testing system for testing a plurality of laser diodes, each laser diode including at least one contact, the laser diode testing system comprising:
   a first transfer device, coupled to an electromagnetic slide, the first transfer device including at least one permanent magnet, the electromagnetic slide including a plurality of magnetic field excitation units arranged in a longitudinal direction of the electromagnetic slide, the plurality of laser diodes being placed on the first transfer device;
   a first photoelectric test station, including a first photoelectric measuring device and a first probe module, wherein each of the first photoelectric measuring device and first probe module include electric circuitry; and
   a main controller, electrically connected to the plurality of magnetic field excitation units of the electromagnetic slide, the first photoelectric measuring device, and the first probe module,
   wherein a magnetic field is generated by at least one of the plurality of magnetic field excitation units of the electromagnetic slide under control of the main controller and interacts with a magnetic field generated by the at least one permanent magnet of the first transfer device, so that the first transfer device is driven to transfer the plurality of laser diodes to the first photoelectric test station or away from the first photoelectric test station;
   when the first transfer device is located at the first photoelectric test station, the first probe module is controlled by the main controller and brought into electrical contact with the at least one contact of each laser diode in sequence, and the first photoelectric measuring device is controlled by the main controller and sequentially measures at least one of an electrical characteristic and an optical characteristic of each laser diode electrically contacted by the first probe module.

2. The laser diode testing system of claim 1, further comprising a guide rail arranged in parallel with the electromagnetic slide, the first transfer device further including a sliding frame coupled to the guide rail and slidable on the guide rail.

3. The laser diode testing system of claim 2, wherein the sliding frame further includes a temperature control unit and a holder assembly, the temperature control unit includes electric circuitry and is coupled to the holder assembly and provided to heat or cool the holder, and the holder assembly is provided to hold the plurality of laser diodes.

4. The laser diode testing system of claim 3, wherein the holder assembly includes a body and a detachable holder, the body includes a negative pressure channel, the detachable holder is provided with at least one suction hole on its upper surface; one end of the negative pressure channel communicates with a negative pressure source, and the other end of the negative pressure channel communicates with the at least one suction hole.

5. The laser diode testing system of claim 4, wherein the detachable holder includes a carrying surface, a vertical surface and a beveled surface, the carrying surface has a width equivalent to a width of the plurality of laser diodes and is provided to carry the plurality of laser diodes, the at least one suction hole is formed on the carrying surface; the vertical surface is connected to one lateral edge of the carrying surface while the beveled surface is connected to the other lateral edge of the carrying surface, and the beveled surface and the carrying surface form an included angle θ in a range from 30 degrees to 90 degrees.

6. The laser diode testing system of claim 1, wherein at least one of the first transfer device and the electromagnetic slide further includes a position signal generating unit, the position signal generating unit includes electric circuitry and is electrically connected to the main controller and provided to generate a real-time position signal by detecting a real-time position of the first transfer device and send the real-time position signal to the main controller.

7. A laser diode testing method for testing a plurality of laser diodes, each laser diode including at least one contact, the method comprising the steps of:
(A) moving the plurality of laser diodes to a first photoelectric test station by a first transfer device including at least one permanent magnet, the first photoelectric test station including a first photoelectric measuring device and a first probe module, wherein each of the first photoelectric measuring device and first probe module include electric circuitry;
(B) controlling the first probe module to electrically contact the at least one contact of each laser diode in sequence and controlling the first photoelectric measuring device to sequentially measuring at least one of an electrical characteristic and an optical characteristic of each laser diode electrically contacted by the first probe module; and
(C) moving the plurality of laser diodes out of the first photoelectric test station by the first transfer device,
wherein the first transfer device is coupled to an electromagnetic slide; the first transfer device includes at least one permanent magnet, and the electromagnetic slide includes a plurality of magnetic field excitation units arranged in a longitudinal direction of the electromagnetic slide to drive the first transfer device in a magnetic levitation manner; in the step (A) and the step (C), a magnetic field is generated by at least one of the plurality of magnetic field excitation units of the electromagnetic slide under control of the main controller and interacts with a magnetic field generated by the at least one permanent magnet of the first transfer device, so that the first transfer device is driven to controllably transfer the plurality of laser diodes to the first photoelectric test station and out of the first photoelectric test station.

8. The method of claim 7, before the step (B), further comprising the step of:
(B0) heating or cooling the plurality of laser diodes by a temperature control unit of the first transfer device.

* * * * *